(12) United States Patent
Lewis, Jr. et al.

(10) Patent No.: US 6,469,590 B1
(45) Date of Patent: Oct. 22, 2002

(54) MARINE ANTENNA WITH AN INTEGRAL FILTER

(75) Inventors: John Richard Lewis, Jr., Little Mountain; Steven Michael Senn, Whitmire, both of SC (US)

(73) Assignee: Shakespeare Company, Newberry, SC (US)

( * ) Notice: Subject to any disclaimer, the term of this patent is extended or adjusted under 35 U.S.C. 154(b) by 0 days.

(21) Appl. No.: 09/597,457

(22) Filed: Jun. 20, 2000

(51) Int. Cl.[7] ............... H01Q 1/32; H03H 7/46; H03H 7/40
(52) U.S. Cl. ............ 333/17.3; 333/175; 333/176; 343/861; 343/713; 455/121
(58) Field of Search ............... 333/17.3, 174, 333/175, 176; 455/121, 125; 343/861, 713

(56) References Cited

U.S. PATENT DOCUMENTS

| | | | | |
|---|---|---|---|---|
| 3,437,931 A | * | 4/1969 | Schultz, Jr. | 455/121 |
| 5,557,290 A | * | 9/1996 | Watanabe | 343/713 |
| 5,874,926 A | * | 2/1999 | Tsuru et al. | 343/860 |
| 5,969,582 A | * | 10/1999 | Boesch et al. | 333/129 |
| 6,054,908 A | * | 4/2000 | Jackson | 333/174 |

OTHER PUBLICATIONS

Constantine A. Balanis, *Antenna Theory Analysis and Design*, pp. 53–65 (1982) Harper & Row, Publishers, Inc.
Shakespeare®, *Antenna Series Galaxy*, pp. 1–11 (Aug., 1999).
Gordon West, *Squelch the squawk in the newer VHF radios*, The Log, pp. 6 and 8 (Sep. 9, 1999).

* cited by examiner

*Primary Examiner*—Robert Pascal
*Assistant Examiner*—Stephen E. Jones
(74) *Attorney, Agent, or Firm*—Renner, Kenner, Greive, Bobak, Taylor & Weber (57) ABSTRACT

An antenna (24) for minimizing reception of undesirable signals below a predetermined frequency band includes a first and a second terminal (A, A') connectable to at least a receiver (22). The antenna components are connected to the first and second terminals, and a filter (26) is integrally connected across the first and second terminals (A, A'). The filter matches an impedance value of the antenna components with an impedance value of the receiver. Moreover, the filter effectively forms a short circuit at the undesirable frequency to minimize reception of undesirable signals below the predetermined frequency band.

4 Claims, 6 Drawing Sheets

MARINE ANTENNA WITH AN INTEGRAL FILTER

TECHNICAL FIELD

This invention relates to antennas. More particularly, this invention relates to a filtered antenna. Specifically, this invention relates to an antenna for marine band applications that filters out undesirable frequencies adjacent to the marine band.

BACKGROUND ART

It is well-known in boating that the marine VHF (very high frequency) band is centered around 156.8 MHz (megahertz)—VHF channel 16. Just above this band, at 157 MHz, are powerful land mobile paging signals. Andjust below channel 16, at 152 MHz are more powerful pager signals. With the increasing use of these pagers, reception of channel 16 by mariners is becoming increasingly difficult. These pager signals mix within the receiver section of most VHF radios and cause loud tones, whistles, and squawks.

For example, if there is a personal "beeper," a radio telephone paging transmitter, located in the area, transmitting at a frequency of 152.48 MHz, it will interfere with the safety calling information on channel 16 at 156.8 MHz. The telephone paging information (beeper) and the safety information are both received by the VHF antenna and passed along to the VHF transceiver. Depending upon the signal strength of the beeper signal, it can overpower the input receiving circuitry of the VHF-radio and cause interference in the form of shrill, squawks, squeaks, whistles, and tones that are at the least an annoyance and at the worst a safety hazard. This is especially problematic in big ship ports and in harbors located near cities.

One attempt to overcome this problem is to use externally mounted notch and band-pass filters. These filters simply plug in on the outside of the marine VHF and are pre-tuned to either pass the marine VHF band, or to notch the offending pager channel frequency. The band-pass filter is tuned specifically to the VHF marine band, and the notch filter to the local paging channel. These filter systems go in series between the marine VHF antenna and the VHF marine radio. These devices do not require any power and their passive design offers more than 40 db attenuation to annoying pager and land mobile interference. Unfortunately, these filters are quite expensive and, in some instances, cost more than the radio itself. Moreover, if the filters are incorrectly installed, they can actually decrease the sensitivity of the marine VHF communication system and reduce its performance.

Thus, the need exists for an economically manufactured antenna which significantly reduces interference from adjacent frequency bands and which provides superior performance at the preferred frequency band.

DISCLOSURE OF INVENTION

It is thus an object of the present invention to provide a marine antenna with an integral filter.

It is another object of the present invention to provide an antenna, as above, which is connectable to a receiver/transceiver for use with any desired frequency within the VHF band that covers the marine band from 156.050 MHz to 157.425 MHz including the distress, safety, and calling channel 16 (156.800 MHz).

It is a further object of the present invention to provide an antenna, as above, in which a filter is an integral part of the antenna for connection to the receiver/transceiver.

It is yet another object of the present invention to provide an antenna, as above, in which the filter includes a power matching feature that matches the impedance of the antenna with the impedance of the receiver/transceiver.

It is yet another object of the present invention to provide an antenna, as above, in which the filter provides a frequency suppression feature that minimizes reception of the undesirable frequency by the receiver/transceiver. It will be appreciated that the undesirable frequency is typically in a frequency band adjacent or very close to the frequency band that is desired to be received by the receiver/transceiver.

It is still another object of the present invention to provide an antenna, as above, wherein the filter provides a minimum of −15 db of isolation at the undesirable frequency; power matches the transceiver to the antenna with a maximum voltage standing wave ratio of 2:1 over the desired frequency band; and provides an insertion loss of −0.5 db or less within the desired frequency band.

It is still a further object of the present invention to provide an antenna, as above, in which the filter includes a shunt circuit that includes a first variable capacitor serially connected to a first inductor, wherein the shunt circuit is connected across the first and second terminals of the antenna; and wherein the filter circuit further includes a power matching tee circuit that includes a second variable capacitor and a fixed capacitor serially connected to the first terminal, and wherein a second inductor is connected at one end between the second variable capacitor and the fixed capacitor and at opposite end is connected to the second terminal.

The foregoing and other objects of the present invention, which shall become apparent as the detailed description proceeds, are achieved by a filter for attenuating undesirable frequency signals between a transceiver and an antenna, includes a power matching circuit for matching the impedance of the antenna and the impedance of the transceiver, and a shunt circuit connected to the power matching circuit, the shunt circuit effectively forming a short circuit at the undesirable frequency to minimize reception of the undesirable frequency by the transceiver.

Other aspects of the present invention are attained by an antenna for minimizing reception of undesirable signals below a predetermined frequency band including a first and a second terminal connectable to at least a receiver, antenna components connected to the first and second terminals, and a filter integrally connected across the first and second terminals, the filter matching an impedance value of the antenna components with an impedance value of the receiver, and the filter effectively forming a short circuit at the undesirable frequency to minimize reception of undesirable signals below the predetermined frequency.

A preferred antenna incorporated in the concepts of the present invention is shown by way of example in the accompanying drawings without attempting to show all the various forms and modifications in which the invention might be embodied, the invention being measured by the appended claims and not by the details of the specification.

BRIEF DESCRIPTION OF THE DRAWINGS

For a complete understanding of the objects, techniques and structure of the invention, reference should be made to the following detailed description and accompanying drawings, wherein.

BEST MODE FOR CARRYING OUT THE INVENTION

Figure 1:
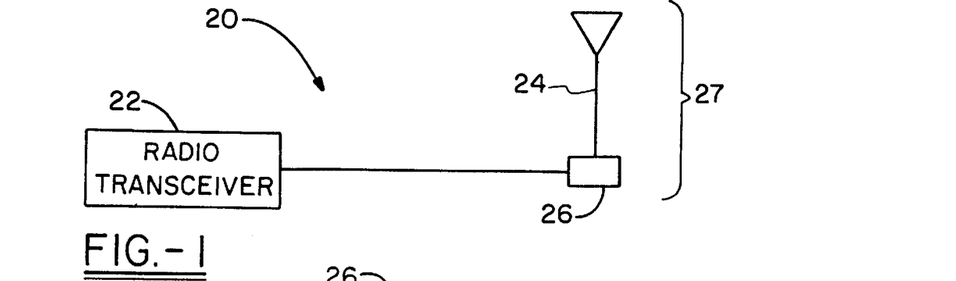
FIG. 1 is a schematic representation of a marine radio system.

A marine radio system utilizing an integral marine antenna filter, made in accordance with the concepts of the present invention, is indicated generally by the numeral 20 in the accompanying drawings and is best seen generally in FIG. 1. The marine radio system includes a radio transceiver 22. Although the present invention is discussed in the context of use with a radio transceiver, it will be appreciated that the aspects of the present invention are equally applicable to antennas used with just receivers. As is common with such transceiver 22, a transmit/receive antenna 24 is connected thereto. As noted in FIG. 2, the transceiver has a terminal A and a terminal A' which connect to a terminal Z and a terminal Z' of the antenna 24. A filter system 26 is integrally incorporated into the antenna 24 and connected to the transceiver 22. Incorporation of the filter system 26 into the antenna body 27 is advantageous inasmuch as the connection of the components is accurate and reliable. The antenna 24 includes components such as a coaxial cable having a center conductor and a shield ground wire, ferrules, and the like. The length of the coaxial cable and, thus, the antenna may be varied according to the particular end use of the antenna.

Figure 2:
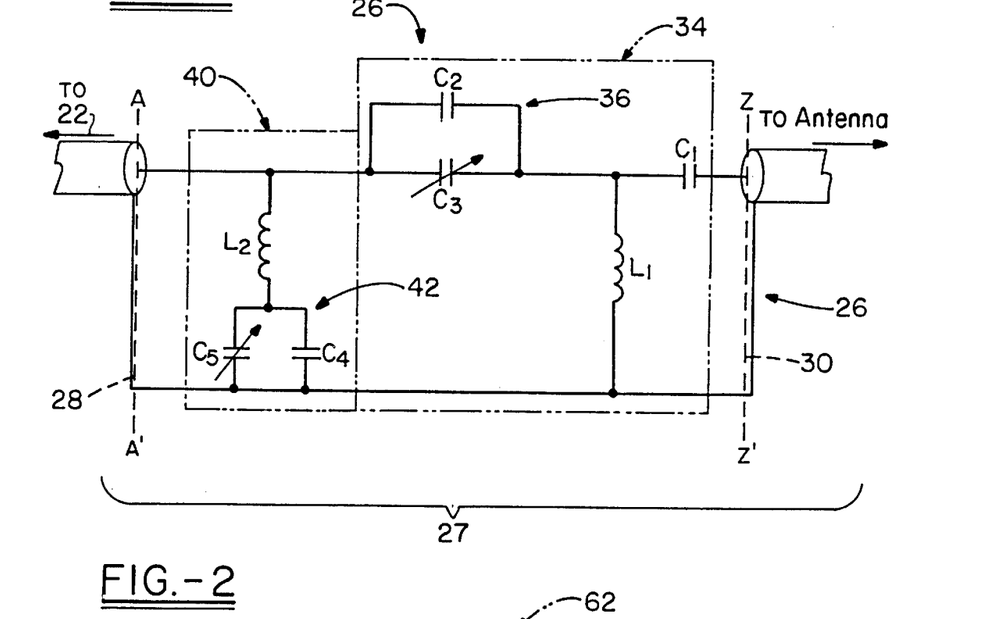
FIG. 2 is an electrical circuit schematic of a filter incorporated into an antenna according to the present invention.

As best seen in FIG. 2, the filter 26 has an end 28 which is connected to the terminal A–A' and an antenna end 30 which is represented by the terminal ends Z–Z'. Included in the filter 26 is a power matching tee circuit 34 which effectively matches the impedance of the antenna components to the impedance of the transceiver for maximum power transfer. The tee circuit 34 includes a capacitor $C_1$ which has one end connected to terminal Z. Serially connected to capacitor to $C_1$ is a variable capacitor network 36 which includes a fixed capacitor $C_2$ that is connected in parallel to a variable capacitor $C_3$. In the preferred embodiment, the approximate values of these capacitors are as follows: $C_1$=15 pF; $C_2$=5 pF; and $C_3$=7–25 pF. As will be discussed in detail below, selection of these values is dependent upon the frequency band desired to be received by the transceiver and the frequency desired to be suppressed. The tee circuit 34 also includes an inductor $L_1$, which has an approximate value of about 0.06 $\mu$H, that is connected between the variable capacitor network 36 and capacitor $C_1$ at one end, while the opposite end is connected to the Z' terminal.

A shunt circuit 40 is also included in the filter 26. It is connected across terminals A and A' and includes a variable capacitor network 42 which includes a capacitor $C_4$ and a variable capacitor $C_5$ connected in parallel. Serially connected to the variable capacitor network 42 is a series inductor $L_2$. In the preferred embodiment, capacitor $C_4$ has an approximate value of 1 pF and capacitor $C_5$ has an approximate value of 0.25–1.5 pF. The inductor $L_2$ has an inductance of about 0.544 micro H.

In order to fully understand development of the component values selected for the filter 26 and how they are connected to one another is revealed in the following discussion. It will be appreciated that this discussion is equally applicable to any situation in which an antenna is desired to receive a predetermined frequency band while minimizing receipt of nearby adjacent or relatively close frequency bands.

Figure 3:
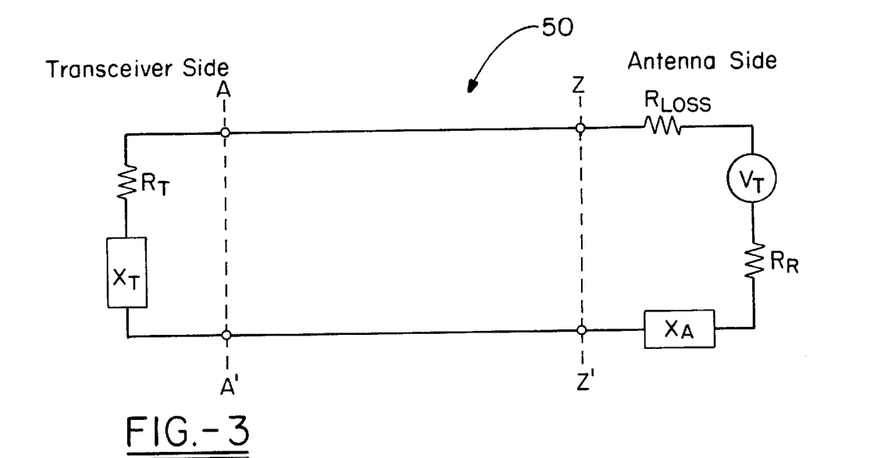
FIG. 3 is a model circuit diagram of an antenna in the receiving mode.

Reference is now made to FIG. 3 which shows an antenna model in the receive mode. This circuit, designated generally by the numeral 50, includes a transceiver side (on the left) and an antenna side (on the right). The circuit 50 is provided with a terminal A–A' and a terminal Z–Z'. The transceiver side includes a transceiver resistance designated by $R_T$ and a reactance designated by $X_T$. The antenna side includes an induced voltage $V_T$ that is generated by an incoming received signal. Also associated with the antenna side is a resistance $R_{LOSS}$ and a resistance $R_R$. A reactance $X_A$ is also designated.

What needs to be determined from this model circuit 50 is the power transferred from the antenna to the transceiver. From the circuit 50, the power transferred can be determined as follows:

$$P_T = |I_T|^2 R_T \tag{1}$$

and in complex notation $$|I_T| \angle \varnothing = \frac{V_T \angle \theta}{(R_T + R_{LOSS} + R_R) + j(X_A + X_T)} \tag{2}$$

where $$|I_T| = \frac{|V_T|}{[(R_T + R_{LOSS} + R_R)^2 + (X_A + X_T)^2]^{1/2}} \tag{3}$$

and $$|I_T|^2 = \frac{|V_T|^2}{(R_T + R_{LOSS} + R_R)^2 + (X_A + X_T)^2} \tag{4}$$

The above values are considered to be peak values. For RMS values, the following equation is used.

$$P_T = \frac{1}{2} \frac{|V_T|^2 R_T}{(R_T + R_{LOSS} + R_R)^2 + (X_A + X_T)^2} \tag{5}$$

This is the power transferred from the receiving antenna to the "load" which, of course, in this case, is the transceiver. The power at the source is:

$$P_{source} = \frac{1}{2} |V_T| |I_T| \tag{6}$$

$$P_s = \frac{1}{2} |V_T| \frac{|V_T|}{[(R_T + R_{LOSS} + R_R)^2 + (X_A + X_T)^2]^{1/2}} \tag{7}$$

Then from the ratio of power delivered to the load to the power at the source $$\frac{P_T}{P_s} = \frac{1}{2} \frac{|V_T|^2 R_T}{(R_T + R_{LOSS} + R_R)^2 + (X_A + X_T)^2} \quad (8)$$

$$\times \frac{2}{1} \frac{[(R_T + R_{LOSS} + R_R)^2 + (X_A + X_T)^2]^{1/2}}{|V_T|^2}$$

A power ratio for the model circuit can be calculated as follows:

$$\frac{P_T}{P_s} = \frac{R_T}{[(R_T + R_{LOSS} + R_R)^2 + (X_A + X_T)]^{1/2}} \quad (9)$$

This is the ratio of the power at the load (transceiver) versus the power available from the source (the antenna). In this ratio, it is desired to express the power ratio in db or decibels. Accordingly, $$db = 10 \log_{10} \frac{P_T}{P_s} \quad (10)$$

for power ratios. Then $$db = 10 \log_{10}\left[\frac{R_T}{((R_T + R_{LOSS} + R_R)^2 + (X_A + X_T)^2)^{1/2}}\right] \quad (11)$$

from $$\log \frac{a}{b} = \log a - \log b \quad (12)$$

and $$\log a^m = m \log a \quad (13)$$

$$db = 10 \log_{10} R_T - 10 \log_{10}[(R_T + R_{LOSS} + R_R)^2 + (X_A + X_T)^2]^{1/2} \quad (14)$$

$$db = 10 \log_{10} R_T - 5 \log_{10}[R_T + R_{LOSS} + R_R)^2 + (X_A + X_T)^2] \quad (15)$$

From equation (15), values for several different circuit elements and conditions can be determined. Accordingly, it is desired to determine the maximum power transfer at the VHF band or, in general, at the desired frequency band. Under perfect conditions $R_T = R_{LOSS} + R_R$ and $X_T = -X_A$. Therefore, equation (15) reduces to:

$$db = 10 \log_{10}(R_T) - 5 \log_{10}[(R_T + R_T)^2 + (X_A - X_A)^2] \quad (16)$$

$$db = 10 \log_{10}(R_T) - 5 \log_{10}(2R_T)^2 \text{ from } \log a^m = m \log a \quad (17)$$

$$db = 10 \log R_T - 10 \log(2R_T) \text{ from } \log ab = \log a + \log b \quad (18)$$

$$db = 10 \log_{10} R_T - 10 \log_{10} R_T - 10 \log_{10} 2 \quad (19)$$

Accordingly, utilizing equations 16–19, the power transferred from the source to the load is under matched conditions equal to one-half the Power captured=Ae Wi, wherein the value Ae equals the antenna's effective aperture and wherein Wi equals the incident power density in watts/meter$^2$. The maximum power that can be transferred to the load (the transceiver) then is 3 decibels down from captured power.

A power matched condition is what is required for operation in the VHF band of 156.05 MHz to 157.425 MHz for both transmit and receive conditions.

Figure 4:
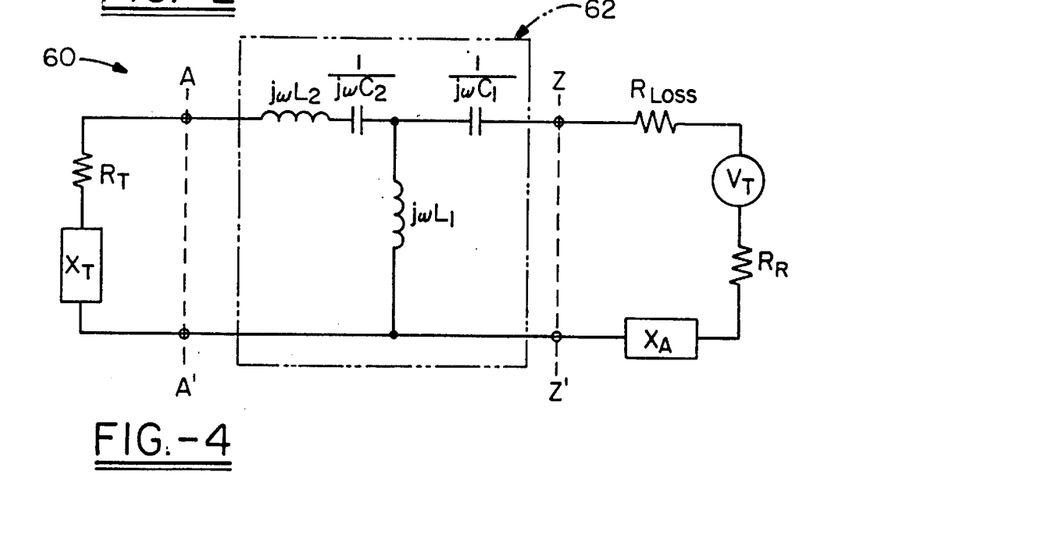
FIG. 4 is an electrical circuit schematic of a power matching tee circuit incorporated into the present invention.

Referring now to FIG. 4, a model circuit 60 was developed to provide power matching for the aforementioned frequency band. Of course, other preferred frequency bands could be used in this determination. This is accomplished by a tee circuit 62 which matches the antenna impedance to the transceiver impedance and, in fact, results in maximum power transfer in the transmit and receive modes. The model circuit 60 was then evaluated at the undesired frequency or, in other words, the frequency which generates the most interference which, in the preferred embodiment, is 152.48 MHz.

Figure 5:
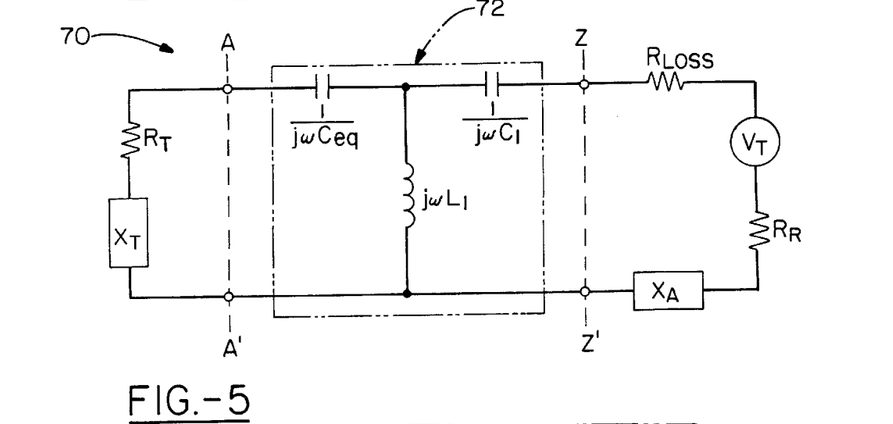
FIG. 5 is an equivalent circuit of the electrical circuit schematic shown in FIG. 4.
Figure 6A:
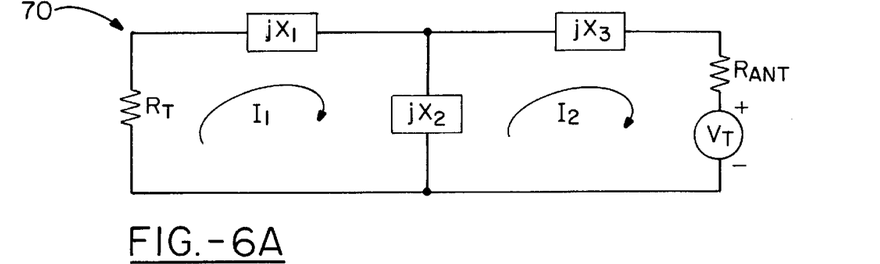
FIGS. 6A–E are schematic circuit diagrams showing the development of values for the components of the tee circuit.

Accordingly, the model circuit 60 at frequencies below the desired band of frequency reduces to a model circuit 70 as seen in FIG. 5. An equivalent tee circuit is generally designated by the numeral 72. The model circuit 70 can be reduced even further. Schematically, this is shown in FIG. 6A so that a mesh analysis can be undertaken. Accordingly, where power is delivered to the transceiver, the power value for the transceiver is calculated to be:

$$P_T = \frac{1}{2}|I_1|^2 R_T \quad (20)$$

and power delivered from the source is determined by:

$$P_s = \frac{1}{2}|V_T||I_2| \quad (21)$$

It will be noted for equations 20 and 21, that all values are converted to RMS values by the one-half factor. Accordingly, the ratio of power is:

$$\frac{P_T}{P_s} = \frac{|I_1|^2 R_T}{|V_T||I_2|} = \frac{|I_1|^2 R_T}{|V_T||I_2|} \quad (22)$$

wherein it is needed to determine $|I_1|$ and $|I_2|$. In the mesh analysis, the following equations are arrived at:

$$I_1(R_T + j(X_1 + X_2)) - I_2(jX_2) = 0 \quad (23)$$

$$-I_1(jX_2) + I_2(R_{ant} + j(X_2 + X_3)) = V_T \quad (24)$$

Using determinants to find $I_1$ and $I_2$, the following matrixes are formed:

$$I_1 = \frac{\begin{vmatrix} 0 & (-jX_2) \\ V_T & (R_{ant} + j(X_2 + X_3)) \end{vmatrix}}{\begin{vmatrix} (R_T + j(X_1 + X_2)) & (-jX_2) \\ (-jX_2) & (R_{ant} + j(X_2 + X_3)) \end{vmatrix}} \quad (25)$$

$$I_2 = \frac{\begin{vmatrix} R_T + j(X_1 + X_2) & 0 \\ (-jX_2) & V_T \end{vmatrix}}{\begin{vmatrix} (R_T + j(X_1 + X_2)) & (-jX_2) \\ (-jX_2) & (R_{ant} + j(X_2 + X_3)) \end{vmatrix}} \quad (26)$$

The above equations can be expressed as:

$$I_1 = \frac{N_1}{D} \quad (27)$$

$$I_2 = \frac{N_2}{D} \quad (28)$$

$$P_s = P_T + \frac{1}{2}|I_2|^2 R_{ant} \tag{29}$$

Then the ratio $P_T/P_s$ becomes $$\frac{P_T}{P_s} = \frac{P_T}{P_T + \frac{1}{2}|I_2|^2 R_{ant}} \tag{30}$$

$$\frac{P_T}{P_s} = \frac{1}{1 + \frac{|I_2|^2}{P_T} R_{ant}} \tag{31}$$

where $$P_T = \frac{1}{2}|I_1|^2 R_T \tag{32}$$

$$\frac{P_T}{P_s} = \frac{1}{1 + \frac{2|I_2|^2 R_{ant}}{2|I_1|^2 R_T}}$$

from $$\frac{|N_1|}{|D|} = |I_1| \tag{33}$$

and $$\frac{|N_2|}{|D|} = I_2 \tag{34}$$

The ratio $$\frac{|I_2|^2}{|I_1|^2} = \frac{|N_2|^2}{|D|^2} \times \frac{|D|^2}{|N_1|^2} = \frac{|N_2|^2}{|N_1|^2} \tag{35}$$

$$\frac{P_T}{P_s} = \frac{1}{1 + \frac{|N_2|^2}{|N_1|^2} \frac{R_{ant}}{R_T}} \tag{36}$$

where $$N_1 = jV_T X_2 \text{ or } V_T X_2 \angle +90° \tag{37}$$

$$|N_1| = |V_T||X_2| \tag{38}$$

where $$N_2 = V_T(R_T + j(X_1 + X_2)) \tag{39}$$

and $$|N_2| = |V_T|(R_T^2 + (X_1 + X_2)^2)^{1/2} \tag{40}$$

$$\frac{P_T}{P_s} = \frac{1}{1 + \frac{|V_T|^2(R_T^2 + (X_1 + X_2)^2)}{|V_T|^2|X_2|^2} \times \frac{R_{ant}}{R_T}} \tag{41}$$

$$\frac{P_T}{P_s} = \frac{1}{1 + \frac{(R_T^2 + (X_1 + X_2)^2)}{|X_2|^2} \times \frac{R_{ant}}{R_T}} \tag{42}$$

For these equations to be useful, the values of $R_T$, $X_1$, $X_2$, and $R_{ant}$ are needed.

Figure 6B:
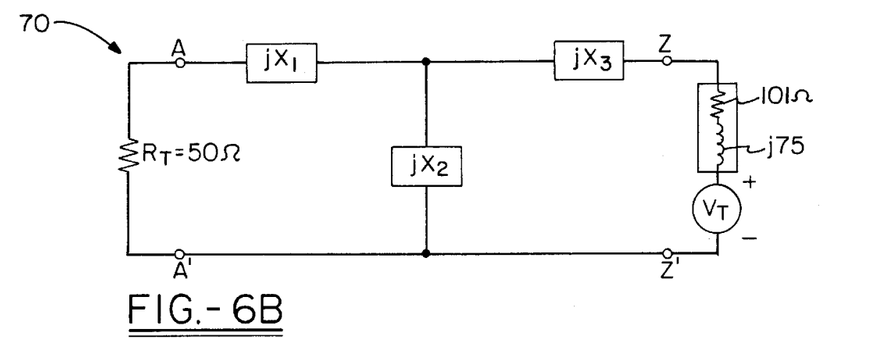

A base-line model is used to establish values for components in the model circuit 70, as shown in FIG. 6B. By equating $jX_3 = -j75$ at the VHF midband, 156.73 MHz, then $X_3 = -75$ ohms, which further reduces to 13.54 pF. Accordingly, the model circuit 70 reduces to matching 101 ohms to 50 ohms as seen in FIG. 6B. The simple circuit of $jX_1$ and $jX_2$ completes the power matching.

In order to determine $X_1$ and $X_2$, $$Q = \sqrt{\frac{Rhigh}{Rlow} - 1} = \sqrt{\frac{101}{50} - 1} \tag{43}$$

$$Q = 1.00995 \text{ or } \approx 1 \tag{44}$$

$$Q = \frac{X_1}{50} \text{ and } Q = \frac{101}{X_2}$$

$$\therefore X_1 = 50 \rightarrow C = 20.3 \text{ pf}$$

$$X_2 = 101 \rightarrow L = 0.103 \text{ } \mu H$$

Figure 6C:
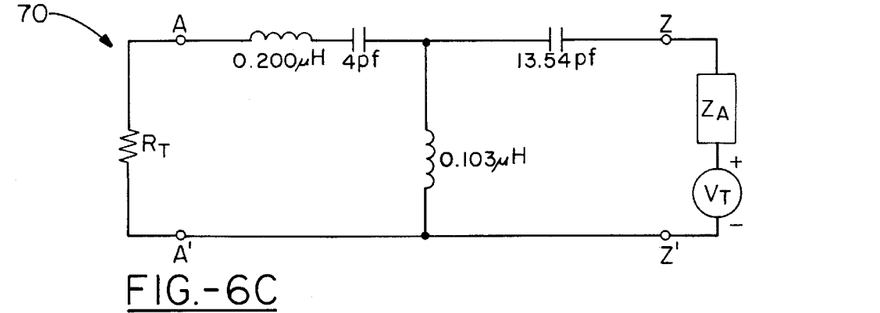

Accordingly, these values fit well for the power matching circuit, shown as the model circuit 70 in FIG. 6C. The 0.200 $\mu$H inductor was added to obtain rejection above the desired VHF band and to provide symmetry to the response curve about the frequency 159.625 MHz in order to obtain good performance in the VHF marine weather band frequencies from 161.825 to 163.275 MHz. Use of the 0.200 $\mu$H for the inductor requires adjusting the adjacent capacitor in $jX_1$ to about 4 pf in order to meet the matching requirements of the VHF frequencies at 156.050–157.425 MHz.

Figure 6D:
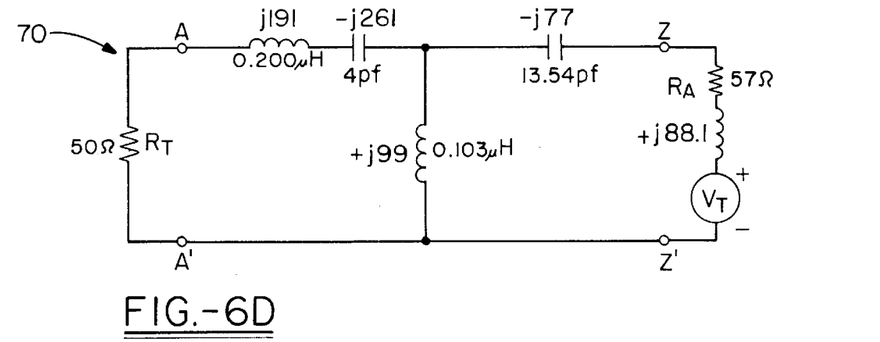

Based upon the model circuit 70 shown in FIG. 6C, it is desirable to obtain the values for the circuit at 152.48 MHz, which is the frequency which is desired to be suppressed. Accordingly, the values for the model circuit 70 are now shown in FIG. 6D. This circuit can be reduced to the value for the model circuit shown in FIG. 6E.

From:

$$\frac{P_T}{P_s} = \frac{1}{1 + \frac{(R_T^2 + (X_1 + X_2)^2)R_{ant}}{|X_2|^2 R_T}} \tag{45}$$

$$\frac{P_T}{P_s} = 720 \times 10^{-3} \tag{46}$$

$$10 \log_{10} \frac{P_T}{P_{source}} = 10 \log_{10} 0.720 = -1.4 \text{ db} \tag{47}$$

Figure 6E:
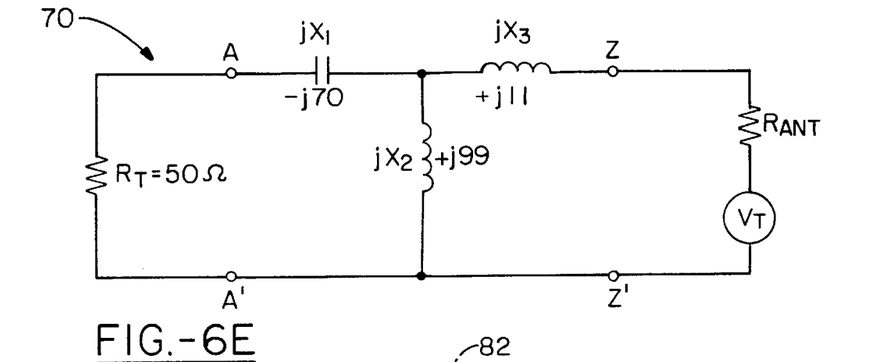

Accordingly, the model circuit 70 provides −1.4 db of isolation at 152.48 MHz. The skilled artisan will appreciate that the power matching features are maintained by the circuit design; however, the model circuit does an inadequate job of isolating the 152.48 MHz beeper frequency from the input of the transceiver. Accordingly, by revisiting the power ratio $$\frac{P_T}{P_s} = \frac{1}{1 + \frac{R_T^2 + (X_1 + X_2)^2 R_{ant}}{|X_2|^2 R_T}} \tag{48}$$

it should be clear that for the frequency desired to be repressed—152.48 MHz—, that $R_{ant}$ is fixed, and that $X_1$ and $X_2$ are fixed for the best power matching at the VHF marine band. Accordingly, there must be some way to change the effective resistance of $R_T$. By redetermining the power ratio, the proper value can be arrived at by letting $R_T$ equate to infinity in the equation $$\frac{P_T}{P_s} = \frac{1}{1 + \frac{(\infty^2 + (X_1 + X_2)^2)Rant}{|X_2|^2 \infty}} \quad (49)$$

$$\frac{R_{ANT}}{\infty} \to 0 \quad (50)$$

$$\frac{P_T}{P_s} = \frac{1}{1 + (\infty^2 + (X_1 + X_2)^2) \times 0} = \frac{1}{1} \text{ for large } R^T \quad (51)$$

$10 \log_{10} 1 = 0$ db of isolation. Next, let $R_T \to 0$

Then $$\frac{R_{ANT}}{0} \to \infty \quad (52)$$

$$\frac{P_T}{P_s} = \frac{1}{1 + (0^2 + (X_1 + X_2)^2) \times \infty}$$

$$= \frac{1}{1 + \infty} \cong \text{a very small number}$$

By example, therefore, obtaining a relatively small power ratio such as $P_T/P_s=0.001$, then the db reduces to −30 db.

Figure 7:
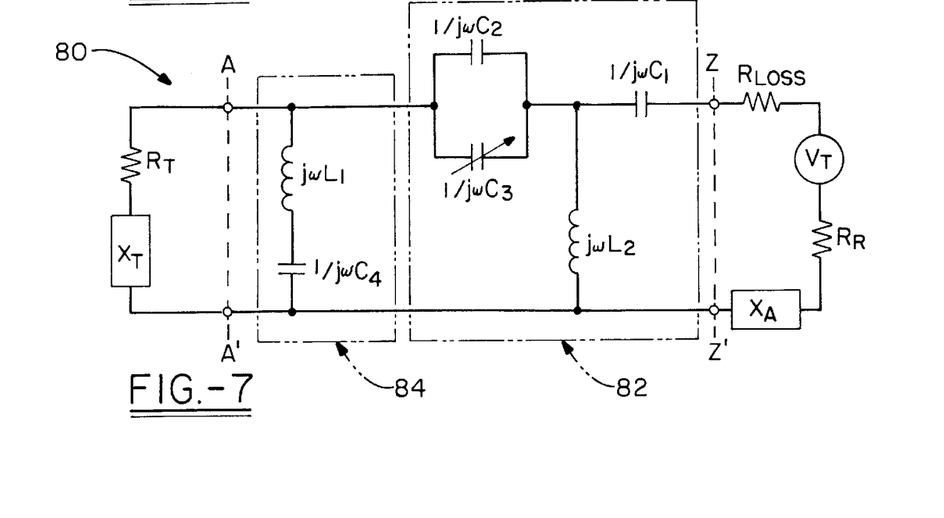
FIG. 7 is a model circuit showing a shunt circuit incorporated into the filter.

Accordingly, in order for the condition of $R_T$ to be equivalent to 0 or a very small value can only be met by placing an approximate short circuit—at 152.48 MHz—across the transceiver input. This is ideally accomplished by the circuit shown in FIG. 7. FIG. 7 shows a circuit 80 that is essentially equivalent to the circuit shown in FIG. 2. The only difference between the FIGS. is that theoretical values are used in FIG. 7. The circuit 80 includes a power matching tee circuit 82 and a shunt circuit 84. A short circuit is effectively placed across terminal A–A' by the shunt circuit 84. This effectively shunts the radio input and is tuned to resonance at 152.48 MHz.

Figure 8:
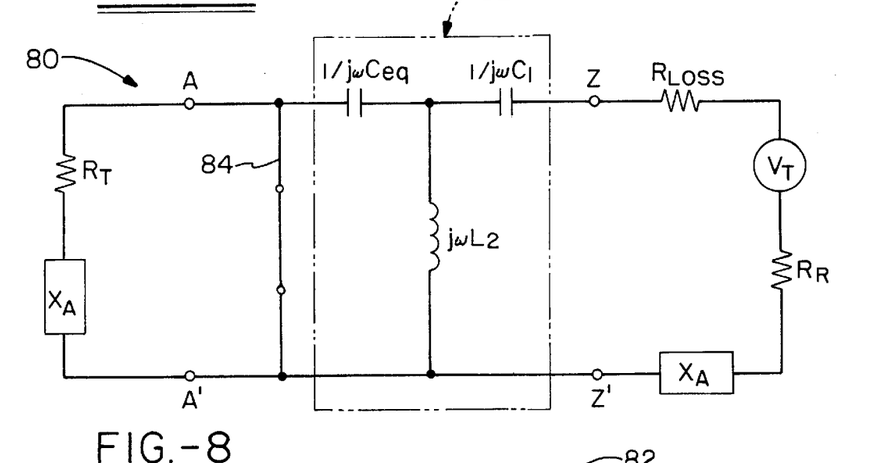
FIG. 8 shows the filter according to the present invention when an undesirable frequency is received.
Figure 9:
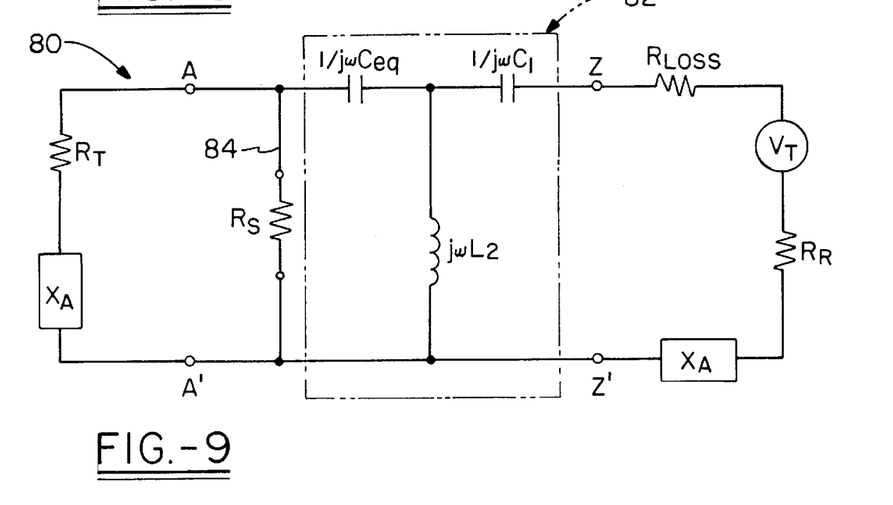
FIG. 9 shows the filter according to the present invention when a desirable frequency is received.

In the ideal circuit, as seen in FIG. 8, the model circuit 80 includes an effective $R_T$ of 0 at 152.48 MHz. However, through the choice of a series inductance of approximately 0.554 µH and a very small capacitance in series therewith, two conditions can be realized. With a high Q coil (the 0.544 µH inductor) the series resistance is small at 152.4 MHz and gives rise to an $R_T$ equivalently equaling 0. Moreover, at the VHF band, the series "trap" combination gives a+jX reactance in parallel with $R_T$ and with the other "tee" components and allows for the power matching at the VHF or desired band frequency. As seen in FIG. 9, this results in the real case scenario of where $R_s << |R_T \pm jX_A|$.

In summary, use of a simple power matching circuit has been found to be inadequate for suppressing an undesired frequency band close to a desired frequency band. While a simple matching circuit is effective in determining what magnitude of attenuation is needed, the desired filter characteristics could not be met. This was determined by the approximate roll-off characteristics of a three element bandpass filter which is approximately −18 db per octave. Accordingly, if 156.050 MHz is at the band path edge, then on the low frequency side, 78.025 MHz would be about −18 db down and only under ideal conditions. Note that an ideal 2:1 frequency ratio is 156.05/78.025=2. With the initial tee circuit provided in order to separate the desired frequency from the undesired frequency, a ratio of 156.050/152.48= 1.0234 is obtained. As will be appreciated by those skilled in the art, this ratio is unacceptable for a regular filter design. Therefore, by using the design methodology set out above, a nearby interfering frequency range can be rendered harmless.

Figure 10:
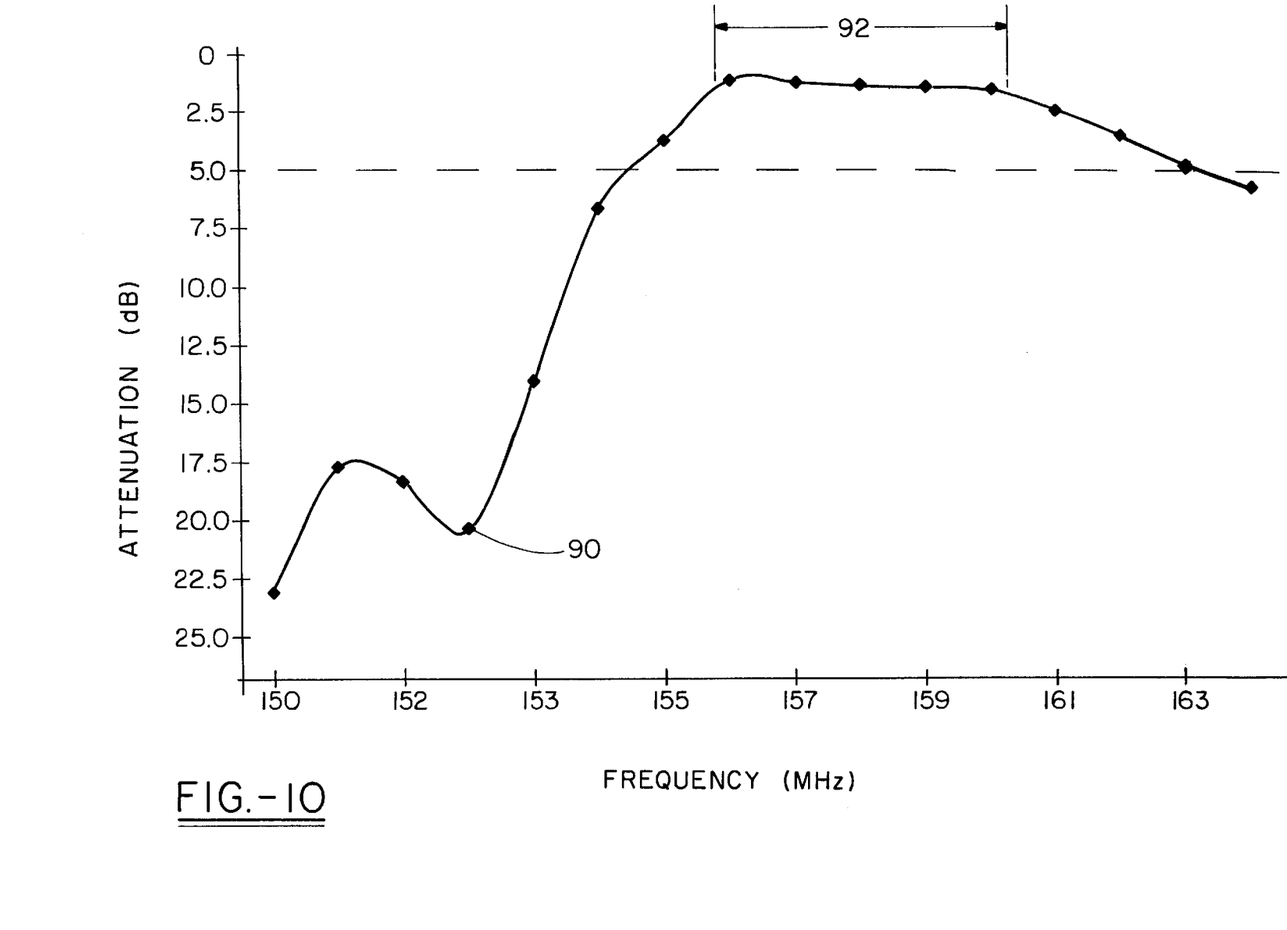
FIG. 10 is a graph showing attenuation versus frequency for a preferred embodiment of the antenna.

By using the filter circuit described hereinabove, the objects of the invention are met. This is evidenced by FIG. 10 which shows the exemplary characterization of an antenna made in accordance with the present invention. The skilled artisan will appreciate the rapid roll-off of interference-causing frequencies, designated by the numeral 90, just below the desired frequency band, designated by the numeral 92. By reducing "out-of-band" signals entering the receiver, not only are annoying squelch breaks controlled, but the signal to noise ratio on the desired frequency band is greatly improved for clearer sounding reception. As evidenced by this graph, the desired performance characteristics of a minimum of −15 db of isolation at the undesirable frequency, power matching the transceiver to the antenna with a maximum voltage standing wave ratio of 2:1 over the desired frequency band, and an insertion loss of −0.5 db or less within the desired frequency band are met.

Figure 11:
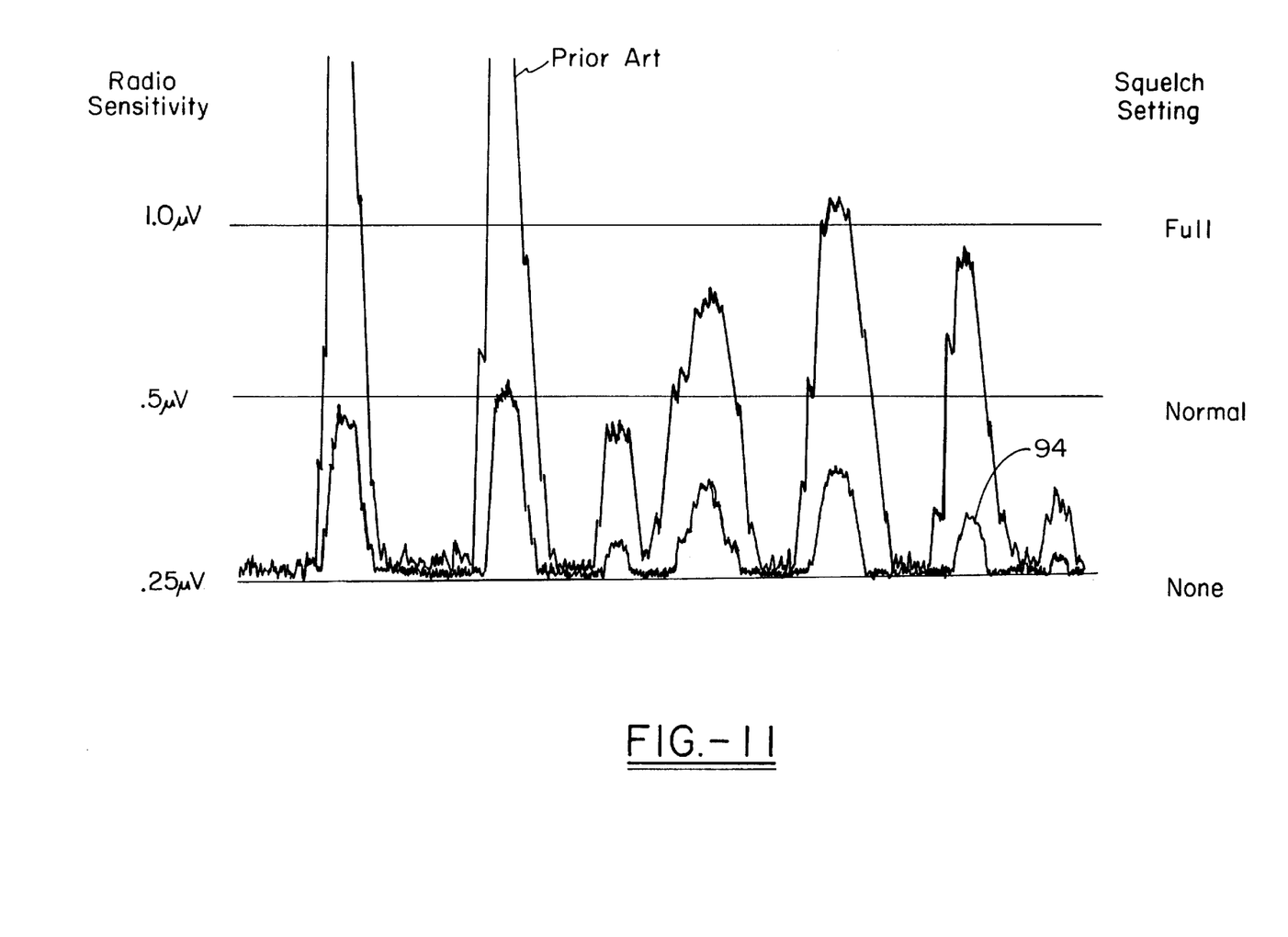
FIG. 11 is a graphical plot comparing receiver responses of a preferred embodiment to that of an ordinary antenna.

FIG. 11 provides a comparison of receiver responses between a prior art antenna and an antenna made according to the present invention, as designated generally by the numeral 94. As can be seen, there is a dramatic reduction of annoying squelch breaks at the "normal squelch" level.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of true scope and breadth of the invention, reference should be made to the following claims.

What is claimed is:

1. A marine antenna connectable to a receiver for minimizing reception of undesirable signals below a predetermined frequency band comprising:

an antenna body, said antenna body having a first and a second terminal connectable to the receiver;

antenna components having a third terminal, said antenna components connected to said second terminal; and a filter incorporated into said antenna body and integrally connected between said first and third terminals and across to the second terminal, said filter matching an impedance value of said antenna components with an impedance value of the receiver, and said filter effectively forming a short circuit at the undesirable frequency to minimize reception of undesirable signals below the predetermined frequency, wherein said filter circuit includes a shunt circuit including a first capacitor serially connected to a first inductor, said shunt circuit connected between said first and third terminals across to said second terminal; and a power matching tee circuit including a second capacitor and a third capacitor serially connected between said first and third terminals, and a second inductor connected at one of its ends between said second capacitor and said third capacitor, and at an opposite end connected to said second terminal, wherein said second inductor is the only component connected at one of its ends between said second capacitor and said third capacitor, and at an opposite end connected to said second terminal.

2. The antenna according to claim 1, wherein said filter provides a minimum of −15 db of isolation at the undesirable frequency, a maximum voltage standing wave ratio of 2:1 and an insertion loss of −0.5 db or less for frequencies greater than the predetermined frequency.

3. The antenna according to claim 2, wherein the predetermined frequency band is about 156 MHz to about 160 MHz.

4. The antenna according to claim 1, wherein said first and second capacitors are variable.

* * * * *